United States Patent
Thompson et al.

(10) Patent No.: US 9,496,707 B2
(45) Date of Patent: Nov. 15, 2016

(54) GENERATOR PROTECTION ELEMENT

(71) Applicant: Schweitzer Engineering Laboratories, Inc., Pullman, WA (US)

(72) Inventors: Michael J. Thompson, O'Fallon, IL (US); Dale S. Finney, Little Bras D'or (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 101 days.

(21) Appl. No.: 14/579,573

(22) Filed: Dec. 22, 2014

(65) Prior Publication Data
US 2016/0181790 A1    Jun. 23, 2016

(51) Int. Cl.
H02H 7/06 (2006.01)
G01R 31/34 (2006.01)
F01D 15/10 (2006.01)

(52) U.S. Cl.
CPC ............... *H02H 7/06* (2013.01); *F01D 15/10* (2013.01); *G01R 31/34* (2013.01)

(58) Field of Classification Search
CPC ...................................... H02H 7/06
USPC ........................................... 361/20
See application file for complete search history.

(56) References Cited

U.S. PATENT DOCUMENTS

| | | |
|---|---|---|
| 2,881,319 A | 4/1959 | Sills |
| 3,727,123 A | 4/1973 | Smith |
| 3,973,171 A | 8/1976 | Howell |
| 4,000,464 A | 12/1976 | Nussel |
| 4,001,646 A | 1/1977 | Howell |
| 4,029,951 A | 6/1977 | Berry |
| 4,066,950 A | 1/1978 | Rumold |
| 4,148,087 A | 4/1979 | Phadke |
| 4,159,499 A | 6/1979 | Breskin |
| 4,161,011 A | 7/1979 | Wilkinson |
| 4,206,398 A | 6/1980 | Janning |

(Continued)

FOREIGN PATENT DOCUMENTS

WO    WO0239642    5/2002

OTHER PUBLICATIONS

PCT/US2015/056870, Patent Cooperation Treaty, International Search Report and Written Opinion of the International Searching Authority, Jan. 14, 2016.

(Continued)

*Primary Examiner* — David Warren
(74) *Attorney, Agent, or Firm* — Jared L. Cherry

(57) ABSTRACT

The present disclosure is applicable to generators with low motoring power. In one embodiment, a generator protection element may include a generator monitoring subsystem configured to measure a real power output and an imaginary power output of a generator. The system may also include an electrical parameter threshold subsystem configured to determine whether the measured real power output and the measured imaginary power output satisfy a tripping characteristic. The tripping characteristic may be defined by a function having a slope with respect to a real power axis and an imaginary power axis. In some embodiments, the function may be a piecewise function that defines a first linear segment having a first slope and a second linear segment having a second slope. The first slope and the second slope may be equal and opposite. A tripping subsystem may issue a trip command based upon satisfaction of the tripping characteristic.

20 Claims, 6 Drawing Sheets

(56) References Cited

U.S. PATENT DOCUMENTS

| | | | |
|---|---|---|---|
| 4,245,182 A | 1/1981 | Aotsu | |
| 4,321,643 A | 3/1982 | Vernier | |
| 4,371,832 A | 2/1983 | Wilson | |
| 4,511,811 A | 4/1985 | Gupta | |
| 4,542,468 A | 9/1985 | Taniguti | |
| 4,556,946 A | 12/1985 | Taniguti | |
| 4,558,309 A | 12/1985 | Antonevich | |
| 4,667,263 A | 5/1987 | Morris | |
| 4,820,991 A | 4/1989 | Clark | |
| 4,825,327 A | 4/1989 | Alexander | |
| 4,851,758 A | 7/1989 | Ostada | |
| 4,939,506 A | 7/1990 | Gram | |
| 5,057,962 A | 10/1991 | Alley | |
| 5,264,778 A | 11/1993 | Kimmel | |
| 5,363,047 A | 11/1994 | Dresti | |
| 5,365,396 A | 11/1994 | Roberts | |
| 5,471,880 A * | 12/1995 | Lang | G01H 1/006 702/56 |
| 5,508,620 A | 4/1996 | Pfiffner | |
| 5,514,963 A | 5/1996 | Korbmacher | |
| 5,519,300 A | 5/1996 | Leon | |
| 5,581,470 A | 12/1996 | Pawloski | |
| 5,592,393 A | 1/1997 | Yalla | |
| 5,633,550 A | 5/1997 | Meehan | |
| 5,675,465 A | 10/1997 | Tanaka | |
| 5,739,693 A | 4/1998 | Pfiffner | |
| 5,764,462 A | 6/1998 | Tanaka | |
| 5,805,395 A | 9/1998 | Hu | |
| 5,933,306 A | 8/1999 | Santos | |
| 5,963,404 A | 10/1999 | Guzman-Casillas | |
| 5,982,595 A | 11/1999 | Pozzuoli | |
| 6,121,886 A | 9/2000 | Anderson | |
| 6,169,489 B1 | 1/2001 | Kliman | |
| 6,262,550 B1 | 7/2001 | Kliman | |
| 6,294,898 B2 | 9/2001 | Lawson | |
| 6,396,284 B1 | 5/2002 | Tisdale | |
| 6,426,632 B1 | 7/2002 | Clunn | |
| 6,459,269 B1 | 10/2002 | Jones | |
| 6,492,801 B1 | 12/2002 | Sims | |
| 6,496,757 B1 | 12/2002 | Flueck | |
| 6,525,504 B1 | 2/2003 | Nygren | |
| 6,714,020 B2 | 3/2004 | Hobelsberger | |
| 6,721,671 B2 | 4/2004 | Roberts | |
| 6,794,879 B2 | 9/2004 | Lawson | |
| 6,794,883 B2 | 9/2004 | Klingel | |
| 6,815,932 B2 | 11/2004 | Wall | |
| 6,839,207 B2 | 1/2005 | Falliot | |
| 6,924,565 B2 | 8/2005 | Wilkins | |
| 6,924,628 B2 | 8/2005 | Thompson | |
| 6,975,946 B2 | 12/2005 | Al-Hamrani | |
| 6,992,490 B2 | 1/2006 | Nomoto | |
| 7,006,935 B2 | 2/2006 | Seki | |
| 7,253,634 B1 * | 8/2007 | Kasztenny | H02H 1/0092 324/509 |
| 7,304,403 B2 | 12/2007 | Xu | |
| 7,498,818 B2 | 3/2009 | Benmouyal | |
| 7,528,611 B2 | 5/2009 | Kasztenny | |
| 7,532,010 B2 | 5/2009 | Kamel | |
| 7,710,693 B2 | 5/2010 | Guzman-Casillas | |
| 7,804,303 B2 | 9/2010 | Benmouyal | |
| 8,405,940 B2 | 3/2013 | Schweitzer | |
| 2001/0001534 A1 | 5/2001 | Lawson | |
| 2002/0128759 A1 | 9/2002 | Sodoski | |
| 2002/0140433 A1 | 10/2002 | Lawson | |
| 2003/0085715 A1 | 5/2003 | Lubkeman | |
| 2005/0033481 A1 | 2/2005 | Budhraja | |
| 2006/0125486 A1 | 6/2006 | Premerlani | |
| 2008/0074810 A1 | 3/2008 | Guzman-Casillas | |
| 2009/0160454 A1 | 6/2009 | Johansson | |
| 2009/0219030 A1 | 9/2009 | Salem | |
| 2009/0254297 A1 | 10/2009 | Bengtsson | |
| 2011/0158786 A1 * | 6/2011 | Molitor | F01K 13/02 415/1 |
| 2012/0112758 A1 | 5/2012 | Weems | |
| 2013/0300209 A1 * | 11/2013 | Long | H01F 38/14 307/104 |
| 2015/0051852 A1 * | 2/2015 | Pan | H02J 3/24 702/60 |
| 2015/0222122 A1 * | 8/2015 | Nuqui | H02P 1/029 307/87 |
| 2016/0049891 A1 * | 2/2016 | Frampton | H02J 3/46 322/25 |

OTHER PUBLICATIONS

Benmouyal, G. "The Impact of Synchronous Generators Excitation Supply on Protection Relays". Schweitzer Engineering Laboratories, Inc. Oct. 29, 2007.

Dale Finney and Gerald Johnson, Loss of Prime Mover (Antimotoring) Protection, IEEE Tutorial on the Protection of Synchronous Generators, Special Publication of the IEEE Power System Relaying Committee, Second Ed., Chapter 3, Section 5, 2011.

IEEE Guide for AC Generator Protection, IEEE STD C37. 102-1006, 2007.

Rik Pintelon, Johan Schoukens, System Identification: A Frequency Domain, Section 4.3 (pp. 119-131), Jan. 1, 2001.

Beckwith Electric Co., M-3425A, Generator Protection, Published: 2001.

Siemens AG, Numerical Machine Protection Manual, Published 1996.

Type DGF Generator Field Relay, ABB Automation, Inc. Feb. 1977.

J.Lewis Blackburn, Protective Relaying Principles and Applications, Chapter 8: Generator Protection, pp. 262-267, 1997.

Tyco Electronics Energy Division, Installation and Operating Instructions R.O.C.O.F. Protection Relay, Nov. 2002.

PCT/US2010/052452, Patent Cooperation Treaty, International Search Report and Written Opinion of the International Searching Authority, Dec. 9, 2010.

Michael Simpson and John Merrell, Low-Sequence Impedances on Generators, Aug. 30, 2000.

Mu Longhua and Li Ziaono, Selective Ground-fault Protection Using an Adaptive Algorithm Model in Neutral Ungrounded Power Systems, IEEE International Conference on Power System Technology, Dec. 2000.

* cited by examiner

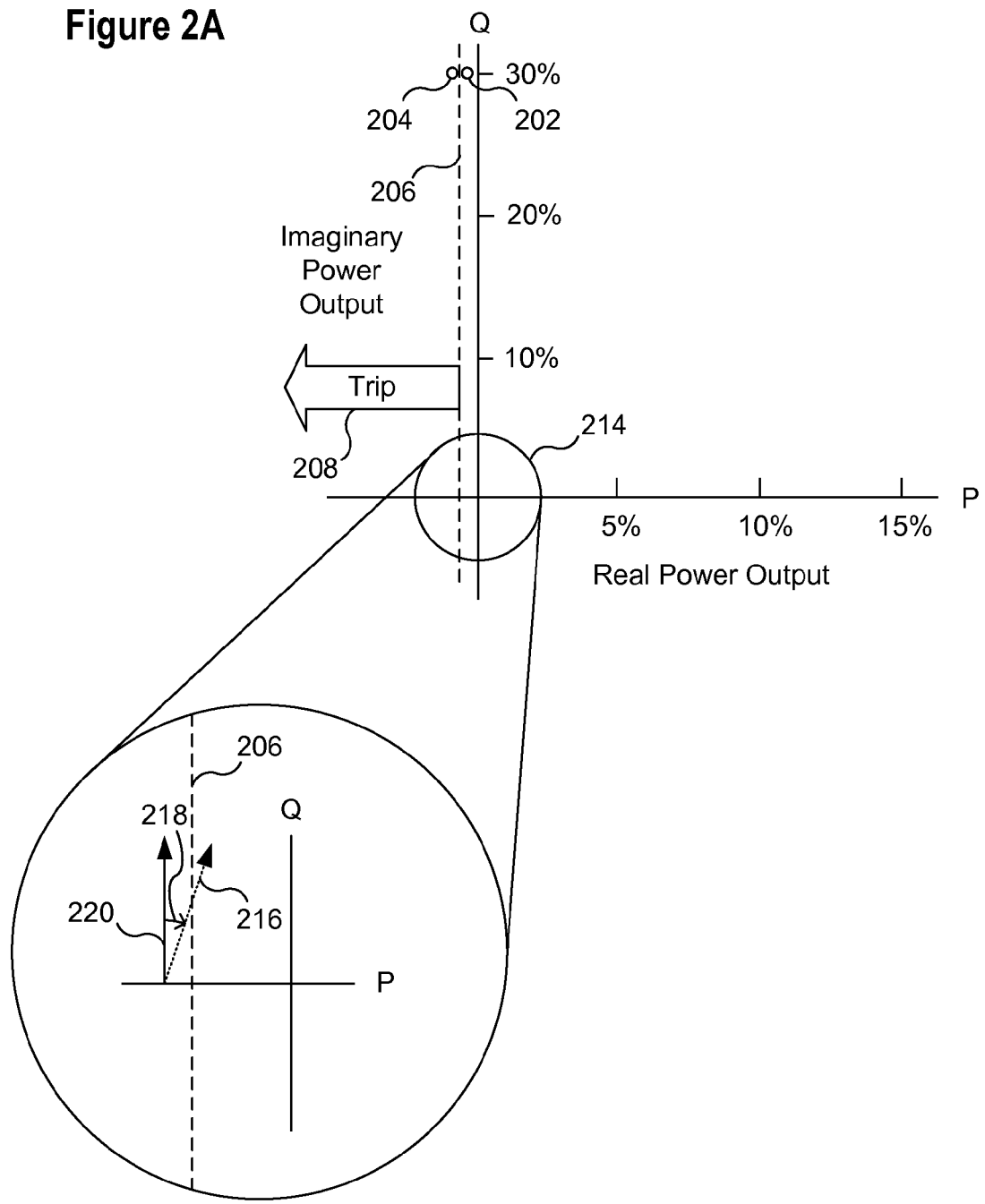

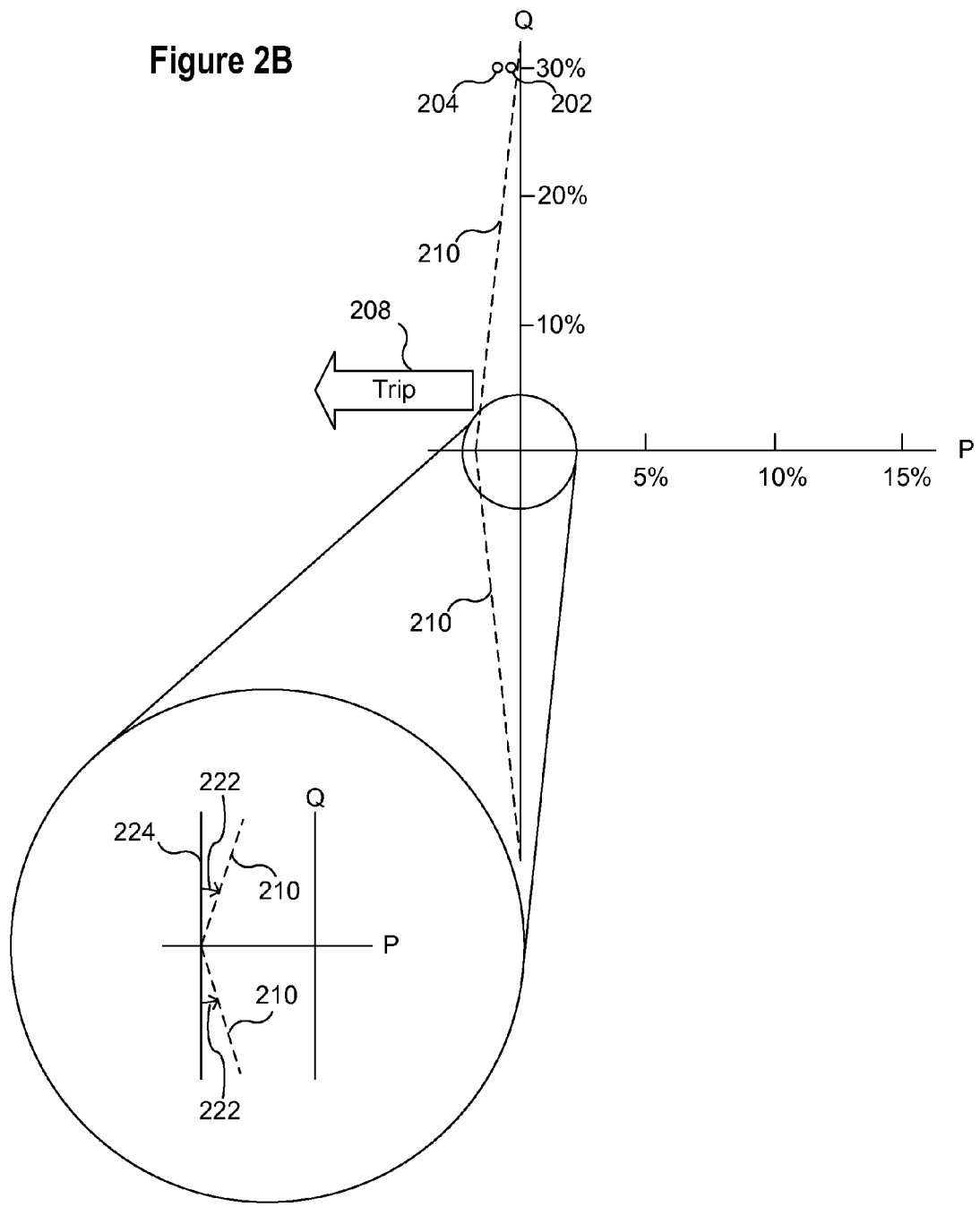

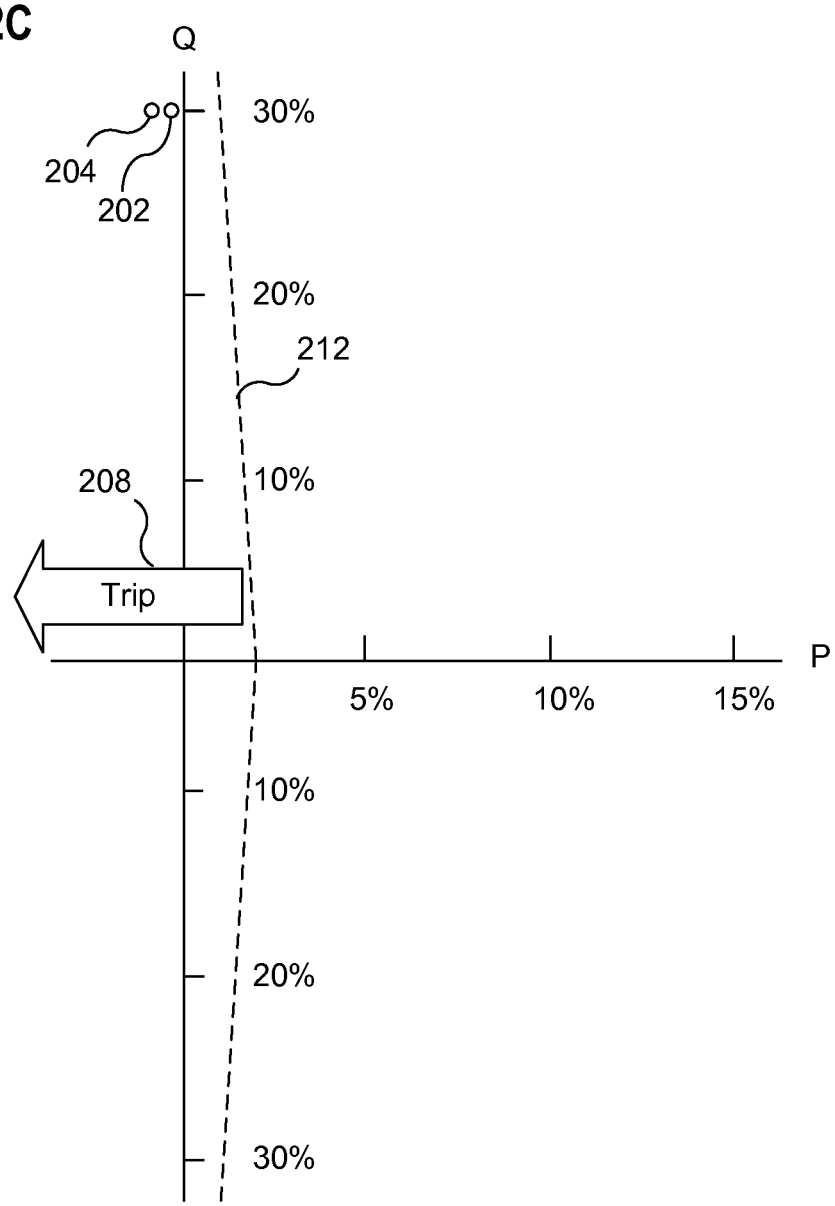

GENERATOR PROTECTION ELEMENT

RELATED APPLICATIONS

None

TECHNICAL FIELD

This disclosure relates to techniques that may be utilized to detect reverse power conditions in electric generators. More particularly, but not exclusively, the present disclosure is applicable to generators with low motoring power.

BRIEF DESCRIPTION OF THE DRAWINGS

Non-limiting and non-exhaustive embodiments of the disclosure are described, including various embodiments of the disclosure with reference to the figures, in which:

FIG. 2A illustrates a plot of a real power measurement, shown on the horizontal axis, versus an imaginary power measurement, shown on the vertical axis, of a generator in a reverse power condition consistent with embodiments of the present disclosure.

FIG. 2B illustrates an alternative plot showing the same operating conditions that are shown in FIG. 2A with a modified tripping characteristic consistent with embodiments of the present disclosure.

FIG. 2C illustrates an alternative plot showing the same operating conditions that are shown in FIG. 2A with another modified tripping characteristic consistent with embodiments of the present disclosure.

Figure 1:
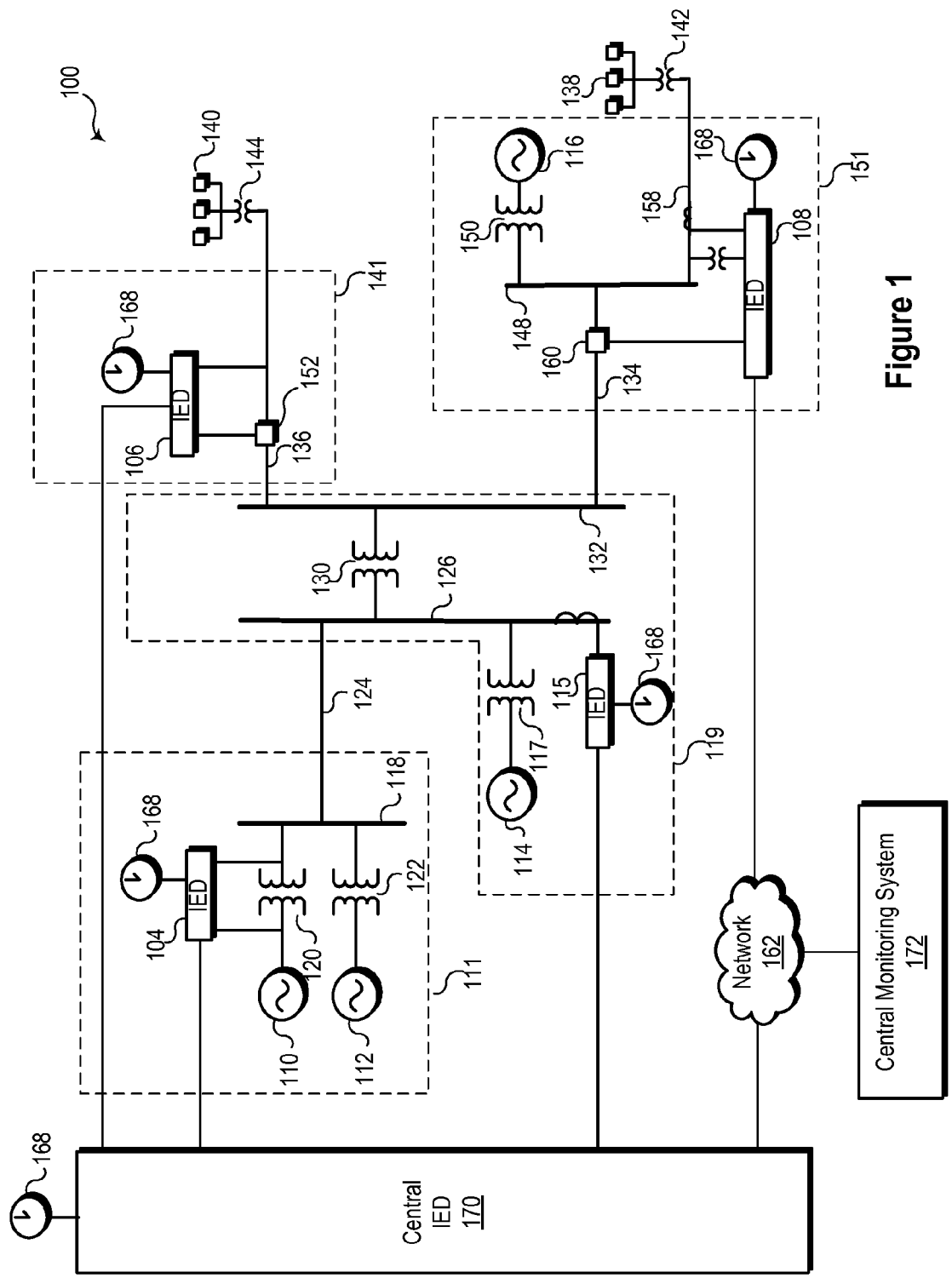
FIG. 1 illustrates an example of an embodiment of a simplified one-line diagram of an electric power delivery system with various substations consistent with embodiments of the present disclosure.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Various conditions may occur that result in a generator drawing power from an electric power generation and transmission system and operating as a motor. Under normal conditions, the generator is driven by the prime mover (e.g., engine or turbine) and the alternator supplies power to the generation and transmission system directly. While transferring power to the grid, the generator is electrically coupled to the generation and transmission system. The prime mover maintains enough torque to maintain the generator in generation mode. If the prime mover fans to maintain rotation of the generator, the generator may transition from a generating mode to a motoring mode if the generator is running in a synchronized condition because a reduction in mechanical power in one generator will cause the other power sources to provide sufficient electric power to maintain synchronization. The flow of power in the reverse direction is known as the reverse power condition. The failure of the prime mover to drive the generator may be caused by a lack of fuel, a problem with the mechanical power controller, or a variety of other issues. In the motoring mode, the generator draws power from the generation and transmission system and behaves as a motor that is coupled to a load (i.e., the prime mover).

In some instances inadvertent motoring may be difficult to detect because the amount of reverse power required to induce motoring may be relatively small. For example, a reverse power flow as small as 0.5% to 3% of the nameplate rating of the generator coupled to a turbine may be enough to cause motoring.

In view of the relatively uncommon occurrence of inadvertent motoring and the difficulty of establishing reliable parameters for detection of inadvertent motoring, some generator operators may fail to implement an adequate anti-motoring detection system. If inadvertent motoring occurs, damage may be caused to generation equipment (e.g., steam turbines), and the operators of such equipment may not become aware of the condition until damage has already been suffered. In addition to potentially causing damage to the failed prime mover and associated generator, a motoring condition may also result in potentially harmful conditions to systems connected to the power bus, such as under or over voltage, under or over frequency, and over current with under frequency (fault current) at the same time.

Systems and methods consistent with the present disclosure may provide increased protection against inadvertent motoring and the resulting damage. Such systems and methods may advantageously have minimal configuration requirements, and may be implemented broadly without concern that such systems and methods will interfere with operation of generators under typical operating conditions. As a result, generation equipment susceptible to damage from inadvertent motoring may be better protected and the safety and reliability of the electric power generation and transmission system may be improved.

During a motoring condition, imaginary power will cause current flow to be at an angle of approximately 90 degrees from the voltage. Small errors in the angle of the current may result in large errors in the real power reading when expressed as a percentage of the generator motoring power. Accordingly, various embodiments consistent with the present disclosure may establish a threshold based on a real power output and an imaginary power output of a generator. The threshold may be modified to allow for reliable operation in the presence of high imaginary power flow.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and/or a product of a process.

The phrases "connected to," "networked," and "in communication with" refer to any form of interaction between two or more entities, including mechanical, electrical, magnetic, and electromagnetic interaction. Two components may be connected to each other, even though they are not in direct physical contact with each other and even though there may be intermediary devices between the two components.

Some of the infrastructure that can be used with embodiments disclosed herein are already available, such as: general-purpose computers, computer programming tools and techniques, digital storage media, and optical networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as: non-volatile memory, static RAM, dynamic RAM, ROM, CD-ROM, disk, tape, magnetic, optical, flash memory, or other computer readable storage medium.

The described features, operations, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order, unless specified to require an order.

In the following description, numerous details are provided to give a thorough understanding of various embodiments. One skilled in the relevant art will recognize, however, that the embodiments disclosed herein can be practiced without one or more of the specific details, or with other methods, components, materials, etc. In other instances, well-known structures, materials, or operations are not shown or described in detail to avoid obscuring aspects of this disclosure.

FIG. 1 illustrates an example of an embodiment of a simplified one-line diagram of an electric power delivery system 100 with various substations consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, and 158), circuit breakers (e.g., breakers 152 and 160), busses (e.g., busses 118, 126, 132, and 148), loads (e.g., loads 140, and 138) and the like. A variety of other types of equipment may also be included in electric power delivery system 100, such as voltage regulators, capacitor banks, and a variety of other types of equipment.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

According to various embodiments, central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

Communication via network 162 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within system 100.

The electric power delivery system 100 illustrated in FIG. 1 may include a generation substation 111. Substation 111 may include various generators 110 and 112 connected to a bus 118 through step-up transformers 120 and 122. Bus 118 may be connected to bus 126 in substation 119 via transmission line 124. Although the equipment in substation 111 may be monitored and/or controlled by various IEDs, only a single IED 104 is shown. IED 104 may be a transformer protection IED for transformer 120.

A common time signal may be distributed throughout system 100. Utilizing a common or universal time source may ensure that IEDs have a synchronized time signal that can be used to generate time synchronized data, such as synchrophasors. In various embodiments, IEDs 104, 106, 108, 115, 170 may receive a common time signal 168. The time signal may be distributed in system 100 using a communications network 162 or using a common time source, such as a Global Navigation Satellite System ("GNSS"), or the like.

In various embodiments, one or more of generators 110, 112, 114, or 116 may be susceptible to damage from a motoring condition. Such a condition may occur when there is a failure in the prime mover, such as an engine or a turbine, which drives the generator. The generators 110, 112, 114, and 116 may be monitored and/or controlled by an IED configured to identify a reverse power condition and to implement a protective action (e.g., tripping) when a reverse power condition is detected to prevent damage to a prime mover connected to one or more of generators 110, 112, 114, or 116.

FIG. 2A illustrates a plot of a real power measurement, shown on the horizontal axis, versus an imaginary power measurement, shown on the vertical axis, of a generator in a reverse power condition consistent with embodiments of the present disclosure. A tripping threshold 206 and arrow 208 indicate the conditions that would result in trip operation. In the illustrated embodiment, the tripping threshold 206 is set at a constant value on the real power axis (P) of approximately 0.5% of the rated generator power. In other embodiments, the tripping threshold may be set at various ranges, typically between 0.5% and 3%.

As illustrated in the enlarged area 214, the trajectory of the actual power flow with increasing imaginary power output from a generator may be represented by arrow 220, while the trajectory of the measured power flow with increasing imaginary power output may be represented by arrow 216. As may be recognized by one of skill in the art, a generator may supply or absorb reactive power from the system. Although the illustrated embodiment depicts a generator that is supplying reactive power to the system, the present disclosure is equally applicable to generators absorbing reactive power from a system. As used herein, the output of a generator may either supply reactive power or absorb imaginary power from a system.

The plot shows a small deviation 218, which may be attributable to the angle error of a current transformer ("CT") used to monitor the generator. The CT angle error may result in a difference between a measured operating point 202 and the actual operating point 204 of the generator. In the illustrated embodiment, the measured operating point 202 represents a 1° error from the actual operating point 204 of the generator. In spite of the fact that the generator represented by the plot in FIG. 2A is operating in a reverse power condition, because the measured operating point 202 remains to the right of the tripping threshold a protection scheme may fail to trip.

FIG. 2B illustrates an alternative plot showing the same operating conditions that are shown in FIG. 2A with a modified tripping characteristic 210 consistent with embodiments of the present disclosure. As illustrated, the tripping characteristic 210 includes a small angle bias 222, with respect to a fixed reverse power threshold 224 such that the greater the imaginary power output becomes, the more dependable the protection scheme becomes to detecting and tripping based on a reverse power flow condition. With the modified tripping characteristic 210 shown in FIG. 2B, the measured operating point 202 with the error is inside the tripping characteristic and the protection scheme will trip dependably. The modified tripping characteristic 210 may accommodate a measurement error (i.e., a difference between the measured operating point 202 and the actual operating point 204) that occurs during a period of high imaginary power output of the generator.

FIG. 2C illustrates an alternative plot showing the same operating conditions that are shown in FIG. 2A with another modified tripping characteristic 212 consistent with embodiments of the present disclosure. As illustrated in FIG. 2C, tripping characteristic 212 is sloped to the left with respect to the P-axis and the Q-axis, which represent the real power output and the imaginary power output of a generator, respectively. The alternate tripping characteristic 212 may be used in some embodiments to reduce the dependability bias of a low forward power tripping characteristic.

The modified tripping characteristic 210 shown in FIG. 2B, is unlikely to interfere with any valid operating condition. In typical operation, a generator would not operate at negative forward power (as in FIG. 2B) or low forward power (as in FIG. 2C) and high imaginary power output. In some embodiments, a tripping condition must exist for a specified time delay before a trip command is issued. Refraining from issuing a trip command until the condition has persisted for a predetermined amount of time may be beneficial for maintaining the security of a system. The delay time may reduce the likelihood of tripping as a result of transient fluctuations and/or startup or shut down operations. In the case of startup, when synchronizing with a positive voltage difference, the generator will pick up VARs immediately upon synchronizing; however, the increase is typically small (i.e., much less than 30% to 40% of the generator rating) where the bias in the tripping characteristic could result in the threshold becoming positive power. Upon being synchronized to an electric power generation and transmission system, both the real and imaginary power are usually ramped up quickly and away from the origin. Tolerance for transient startup conditions may be implemented using a time delay in the protection scheme that requires a low forward power output condition to persist for a threshold period of time. Accordingly, the modified tripping characteristic 212 may be implemented in a wide variety of applications without the need for customization or determination of specific parameters associated with a particular generator.

Figure 3:
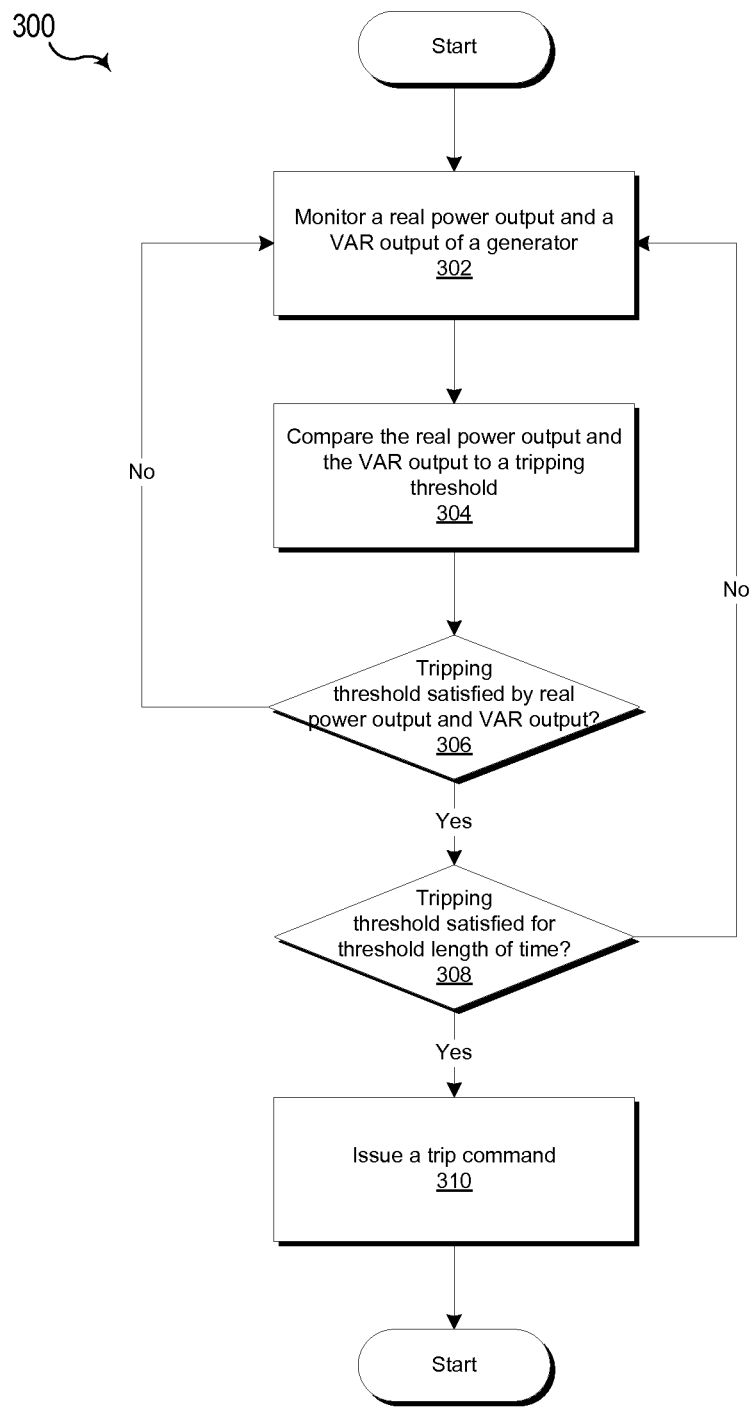
FIG. 3 illustrates a flow chart of a method of monitoring an electrical generator using a generator protection relay consistent with embodiments of the present disclosure.

FIG. 3 illustrates a flow chart of a method 300 of monitoring an electrical generator using a generator protection relay consistent with embodiments of the present disclosure. At 302, a system implementing method 300 may monitor a real power output and an imaginary power output of a generator. In various embodiments, a current transformer and a voltage transformer may be used to monitor the real power output of the generator and the imaginary power output of the generator. At 304, the real power output and the imaginary power output may be compared to a tripping characteristic. In various embodiments, the tripping characteristic may be defined as a mathematical function that may be plotted on a PQ diagram (such as the PQ diagrams shown in FIGS. 2A-2C). The function may be a linear function or other type of function that has a slope with respect to the axes in the PQ diagram. In other words, the function is not at all points at a right angle to either the P-axis or the Q-axis.

At 306, method 300 may determine whether the tripping characteristic is satisfied by the real power output and the imaginary power output of the generator. If the tripping characteristic is not satisfied by the real power output and the imaginary power output of the generator, method 300 may return to 302. As described above, the tripping condition may, in some embodiments, represent a reverse power condition and may require an increasing real power output of the generator for a greater imaginary power output of the generator. In other words, the threshold may slope toward the positive P-axis. In other embodiments, the tripping condition may represent a low forward power condition and the tripping condition may require a decreasing forward power output of the generator for a greater VAR output. In other words, the threshold may slope toward the negative P-axis.

If the tripping characteristic is satisfied at 306, method 300 may proceed to 308, where method 300 may determine whether the tripping characteristic is satisfied for a specified time delay. In various embodiments, the threshold length of time may be sufficiently long to exclude transient conditions, but sufficiently short to initiate a protective action before damage. If the condition that causes the tripping characteristic to be satisfied abates before the time delay elapses, method 300 may return to 302. In one specific embodiment, the time delay may be approximately 30 seconds. In other embodiments, the time delay may be less than 30 seconds or may be greater than 30 seconds.

If the tripping characteristic is satisfied for the threshold length of time at 308, method 300 may proceed to issue a trip command at 310. In some embodiments, method 300 may be implemented by a generator protection IED that may issue a trip command to an electrical interruption device (e.g., a breaker, a recloser, etc.) configured to electrically disconnect the generator from an electric power generation and transmission system after a shutdown sequence has been completed. The shutdown sequence may ensure that all sources of energy have been removed from the generator by tripping the mechanical source of energy to the prime mover, tripping the field to remove the DC energy that generates the voltage, and tripping the breaker to electrically disconnect the generator from the electric power generation system. In alternative embodiments, the trip command may be transmitted to a remote device.

Aspects of certain embodiments described herein may be implemented as software modules or components. As used herein, a software module or component may include any type of computer instruction or computer executable code located within a computer readable storage medium. A software module may, for instance, comprise one or more physical or logical blocks of computer instructions, which may be organized as a routine, program, object, component, data structure, and the like that performs one or more tasks or implements particular abstract data types.

In certain embodiments, a particular software module may comprise disparate instructions stored in different locations of a computer readable storage medium, which together implement the described functionality of the module. Indeed, a module may comprise a single instruction or many instructions, and may be distributed over several different code segments, among different programs, and across several computer readable storage media. Some embodiments may be practiced in a distributed computing environment where tasks are performed by a remote processing device linked through a communications network. In a distributed computing environment, software modules may be located in local and/or remote computer readable storage media. In addition, data being tied or rendered together in a database record may be resident in the same computer readable storage medium, or across several computer readable storage media, and may be linked together in fields of a record in a database across a network.

The software modules described herein tangibly embody a program, functions, and/or instructions that are executable by computer(s) to perform tasks as described herein. Suitable software, as applicable, may be readily provided by those of skill in the pertinent art(s) using the teachings presented herein and programming languages and tools, such as XML, Java, Pascal, C++, C, database languages, APIs, SDKs, assembly, firmware, microcode, and/or other languages and tools.

Figure 4:
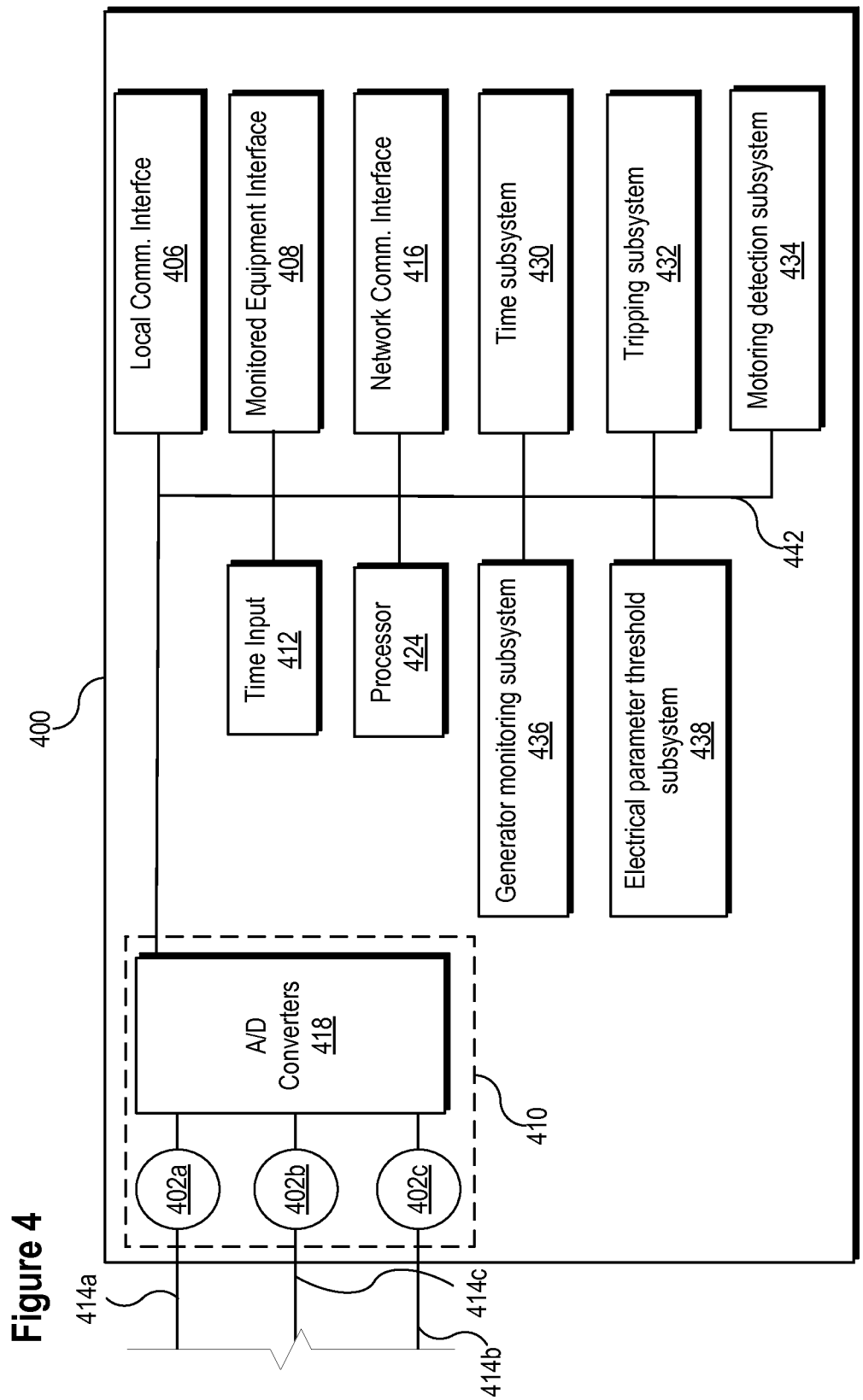
FIG. 4 illustrates a function block diagram of a generator protection element configured to monitor the real power output and the imaginary power output of a generator and to improved dependability by allowing a trip operation of the generator in a motoring condition consistent with embodiments of the present disclosure.

FIG. 4 illustrates a function block diagram of a generator protection element 400 configured to monitor the real power output and the imaginary power output of a generator and to prevent operation of the generator in a motoring condition consistent with embodiments of the present disclosure. Generator protection element 400 may be configured to perform a variety of tasks using a configurable combination of hardware, software, firmware, and/or any combination thereof. FIG. 4 illustrates an embodiment that includes hardware and software, various embodiments of the present disclosure may be implemented in an embedded system, field programmable gate array implementations, and specifically designed integrated circuit. In some embodiments, functions described in connection with various software modules may be implemented in various types of hardware. Moreover, certain components or functions described herein may be associated with other devices or performed by other devices. The specifically illustrated configuration is merely representative of one embodiment consistent with the present disclosure.

Generator protection element 400 includes a network communications interface 416 configured to communicate with other IEDs and/or system devices. In certain embodiments, the network communications interface 416 may facilitate direct communication with another IED or communicate with another IED over a communications network. The network communications interface 416 may facilitate communications with multiple IEDs. Generator protection element 400 may further include a time input 412, which may be used to receive a time signal allowing generator protection element 400 to apply a time-stamp to the acquired samples. In certain embodiments, a common time reference may be received via communications interface 416, and accordingly, a separate time input may not be required for time-stamping and/or synchronization operations. One such embodiment may employ the IEEE 1588 protocol. A monitored equipment interface 408 may be configured to receive status information from, and issue control instructions to, a piece of monitored equipment. In some embodiments, the monitored equipment may be a generator, and generator protection element 400 may be configured to control the operation of the generator.

A local communication interface 406 may also be provided for local communication with generator protection element 400. The local communication interface 406 may be embodied in a variety of ways, including as a serial port, a parallel port, a Universal Serial Bus (USB) port, an IEEE 1394 Port, and the like.

In certain embodiments, generator protection element 400 may include a sensor component 410. In the illustrated embodiment, sensor component 410 is configured to gather data directly from a plurality of conductors 414*a-c* and may use, for example, A/D converters 418 that may sample and/or digitize filtered waveforms to form corresponding digitized current and voltage signals provided to data bus 442. Conductors 414*a-c* may be electrically connected to an output of a generator. In some embodiments transformers (402*a*, 402*b* 402*c*) may reduce the voltage or current to a level appropriate for monitoring the generator using protection element 400. A/D converters 418 may include a single A/D converter or separate A/D converters for each incoming signal. A current signal may include separate current signals from each phase of a three-phase electric power system. A/D converters 418 may be connected to processor 424 by way of data bus 442, through which representations of electrical parameters determined by sensor elements 402*a-c* may be transmitted to processor 424. In various embodiments, the representations of electrical parameters may represent parameters, such as currents, voltages, frequencies, phases, and other parameters associated with an electric power distribution system. Sensor elements 402*a-c* may represent a variety of types of elements, such as voltage transformers, current transformers, status inputs, a breaker controller, etc.

Processor 424 may be configured to process communications received via communications interface 416, time input 412, monitored equipment interface 408, local communications interface 406, and/or sensor component 410. Processor 424 may operate using any number of processing rates and architectures. Processor 424 may be configured to perform various algorithms and calculations described herein. Processor 424 may be embodied as a general purpose integrated circuit, an application specific integrated circuit, a field-programmable gate array, and/or any other suitable programmable logic device.

A generator monitoring subsystem 436 may be configured to monitor a real power output and an imaginary power output of a generator. In various embodiments, data received from A/D converters 418 may be analyzed by the generator monitoring subsystem 436. Further, such data may be stored for later use and/or transmitted by generator protection element 400 to another device or system in communication with generator protection element 400.

An electrical parameter threshold subsystem 438 may be configured to compare the real power output and the imaginary power output of the generator to a tripping characteristic. The tripping characteristic may be represented, in various embodiments, as a mathematical function relating the real power output to the imaginary power output. A variety of types of functions may be used in embodiments consistent with the present disclosure.

A time subsystem 430 may be configured to determine a length of time during which the tripping characteristic is satisfied. In various embodiments, the time subsystem 430 may receive time information from time input 412 and use such information to determine the length of time during which the real power output and the imaginary power output satisfies the tripping characteristic. In some embodiments, the time system may include an internal time keeping system (not shown) that may be used to determine whether the tripping characteristic is satisfied for a specified time delay. In some embodiments, the threshold time delay may be determined with reference to the number of cycles of the electric power generation and distribution system.

A tripping subsystem 432 may be configured to issue a trip command based upon satisfaction of the tripping characteristic and satisfaction of the length of time. In various embodiments, the tripping subsystem 432 may be in communication with a breaker, recloser, or other device that may be configured to interrupt an electrical connection between the generator and an electric power generation and transmission system.

In some embodiments, generator protection element 400 may be configured to require detection of the motoring condition by a motoring detection subsystem 434 prior to issuing the trip command. The motoring detection subsystem 434 may be configured in various embodiments to detect a motoring condition based on the real power output and the imaginary power output of the generator. More specifically, the motoring detection subsystem 434 may be configured to detect a reverse power condition or a low forward power condition coupled with a high power angle (e.g., approximately 90°). In other embodiments, the motoring detection subsystem 434 may be configured to detect the motoring condition in other ways. For example, the motoring detection subsystem 434 may include a device that physically monitors the motion of the generator.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed:

1. A system, comprising:
    a steam turbine;
    a generator coupled to the steam turbine and configured to generate electrical energy from mechanical energy provided by the steam turbine, and the generator in electrical communication with an electric power generation and transmission system;
    an intelligent electronic device (IED), comprising:
        a generator monitoring subsystem configured to measure a real power output and an imaginary power output of a generator;
        an electrical parameter threshold subsystem configured to determine whether the measured real power output and the measured imaginary power output satisfy a tripping characteristic, the tripping characteristic being defined by a function having a first slope above a real power axis and a second slope below the real power axis, the first slope and the second slope being equal and opposite, and the measured imaginary power output of the generator;
        a time subsystem configured to determine a length of time during which the tripping characteristic is satisfied; and
        a tripping subsystem configured to issue a trip command based upon satisfaction of the tripping characteristic for the length of time and a motoring condition;

an electrical interrupter configured to selectively interrupt an electrical connection between the generator and the electric power generation and transmission system based on the trip command.

2. The system of claim 1, wherein the function accommodates a measurement error that occurs during a period of high measured imaginary power output of the generator.

3. The system of claim 1, wherein the tripping characteristic correlates a decrease in the measured real power output of the generator with an increase in the measured imaginary power output of the generator.

4. A generator protection element, comprising:
a generator monitoring subsystem configured to measure a real power output and to measure an imaginary power output of a generator;
an electrical parameter threshold subsystem configured to determine whether the measured real power output and the measured imaginary power output satisfy a tripping characteristic, the tripping characteristic being defined by a function having a slope with respect to a real power axis and an imaginary power axis, wherein the function comprises a piecewise function having a first slope above a real power axis and a second slope below the real power axis, the first slope and the second slope being equal and opposite;
a tripping subsystem configured to issue a trip command based upon satisfaction of the tripping characteristic.

5. The generator protection element of claim 4, further comprising a time subsystem configured to determine a length of time during which the tripping characteristic is satisfied; and wherein the tripping subsystem is further configured to issue the trip command based on the length of time.

6. The generator protection element of claim 4, further comprising:
a sensor element in electrical communication with the generator and configured to measure the measured real power output and the measured imaginary power output of the generator.

7. The generator protection element of claim 4, wherein the slope is constant and the function comprises a linear function.

8. The generator protection element of claim 4, wherein the function comprises a piecewise linear function.

9. A generator protection element, comprising:
a generator monitoring subsystem configured to measure a real power output and to measure an imaginary power output of a generator;
an electrical parameter threshold subsystem configured to determine whether the measured real power output and the measured imaginary power output satisfy a tripping characteristic, the tripping characteristic being defined by a piecewise linear function having a slope with respect to a real power axis and an imaginary power axis;
a tripping subsystem configured to issue a trip command based upon satisfaction of the tripping characteristic;
wherein the piecewise linear function defines a first linear segment having a first slope and a second linear segment having a second slope, wherein the first slope and the second slope are equal and opposite.

10. The generator protection element of claim 4, wherein the function defines a reverse power condition and correlates an apparent increase in the measured real power output of the generator with an increase in the measured imaginary power output of the generator.

11. The generator protection element of claim 4, further comprising:
a motoring detection subsystem configured to detect a motoring condition based on the measured real power output and the measured imaginary power output of the generator; and
wherein the motoring detection subsystem is configured to require detection of the motoring condition prior to issuing the trip command.

12. The generator protection element of claim 4, wherein the generator is configured to receive mechanical energy from a turbine.

13. A method of monitoring an electrical generator using a generator protection element, comprising:
measuring a real power output and an imaginary power output of a generator;
determining whether the measured real power output and the measured imaginary power output satisfy a tripping characteristic, the tripping characteristic being defined by a function having a slope with respect to a real power axis and an imaginary power axis, wherein the function comprises a piecewise function having a first slope above a real power axis and a second slope below the real power axis, the first slope and the second slope being equal and opposite;
determining a length of time during which the tripping characteristic is satisfied; and
issuing a trip command based upon satisfaction of the tripping characteristic for the length of time.

14. The method of claim 13, wherein the slope is constant and the function comprises a linear function.

15. The method of claim 13, wherein the function comprises a piecewise linear function.

16. The method of claim 13, wherein the function defines a reverse power condition and correlates an increase in the measured real power output of the generator with an increase in the measured imaginary power output of the generator.

17. The method of claim 13, further comprising:
detecting a motoring condition based on the measured real power output and the measured imaginary power output of the generator; and
requiring detection of the motoring condition prior to issuing the trip command.

18. The method of claim 17, further comprising removing all sources of electro mechanical energy from the generator.

19. The method of claim 13, further comprising:
measuring the measured real power output and the measured imaginary power output of the generator using a sensor element in electrical communication with the generator.

20. The method of claim 13, wherein the slope is oriented toward the positive P axis.

* * * * *